(12) United States Patent
Chung et al.

(10) Patent No.: US 11,699,733 B2
(45) Date of Patent: Jul. 11, 2023

(54) SEMICONDUCTOR DEVICES

(71) Applicant: Taiwan Semiconductor Manufacturing Co., Ltd., Hsinchu (TW)

(72) Inventors: Cheng-Ting Chung, Hsinchu (TW); Ching-Wei Tsai, Hsinchu (TW); Kuan-Lun Cheng, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 25 days.

(21) Appl. No.: 17/397,099

(22) Filed: Aug. 9, 2021

(65) Prior Publication Data

US 2021/0367053 A1 Nov. 25, 2021

Related U.S. Application Data

(62) Division of application No. 16/415,193, filed on May 17, 2019, now Pat. No. 11,088,255.

(51) Int. Cl.
*H01L 29/423* (2006.01)
*H01L 29/66* (2006.01)
(Continued)

(52) U.S. Cl.
CPC .......... *H01L 29/42392* (2013.01); *H01L 21/823412* (2013.01); *H01L 21/823418* (2013.01);
(Continued)

(58) Field of Classification Search
CPC ......... H01L 29/42392; H01L 29/66795; H01L 29/785; H01L 29/66545; H01L 29/66439; H01L 21/823431; H01L 27/0886
See application file for complete search history.

(56) References Cited

U.S. PATENT DOCUMENTS 8,536,029 B1 9/2013 Chang et al.
8,796,666 B1 8/2014 Huang et al.
(Continued)

FOREIGN PATENT DOCUMENTS

TW 201730938 A 9/2017

OTHER PUBLICATIONS

Irie, H. et al., "In-Plane Mobility Anisotropy and Universality Under Uni-axial Strains in n- and p-MOS Inversion Layers on (100), (110), and (111) Si", IEDM Technical Digest, Dec. 2004, 4 pages.

*Primary Examiner* — Joseph C. Nicely
(74) *Attorney, Agent, or Firm* — Haynes and Boone, LLP

(57) ABSTRACT

A semiconductor device and a method of forming the same are provided. The semiconductor device includes a first gate-all-around (GAA) transistor over a first region of a substrate and a second GAA transistor over a second region of the substrate. The first GAA transistor includes a plurality of first channel members stacked along a first direction vertical to a top surface of the substrate and a first gate structure over the plurality of first channel members. The second GAA transistor includes a plurality of second channel members stacked along a second direction parallel to the top surface of the substrate and a second gate structure over the plurality of second channel members. The plurality of first channel members and the plurality of second channel members comprise a semiconductor material having a first crystal plane and a second crystal plane different from the first crystal plane. The first direction is normal to the first crystal plane and the second direction is normal to the second crystal plane.

20 Claims, 18 Drawing Sheets

(51) Int. Cl.
  *H01L 27/088* (2006.01)
  *H01L 29/78* (2006.01)
  *H01L 21/8234* (2006.01)
(52) U.S. Cl.
  CPC .. *H01L 21/823431* (2013.01); *H01L 27/0886* (2013.01); *H01L 29/66439* (2013.01); *H01L 29/66545* (2013.01); *H01L 29/66795* (2013.01); *H01L 29/785* (2013.01)

(56) References Cited

U.S. PATENT DOCUMENTS

| | | |
|---|---|---|
| 8,815,712 B2 | 8/2014 | Wan et al. |
| 8,963,258 B2 | 2/2015 | Yu et al. |
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,576,814 B2 | 2/2017 | Wu et al. |
| 9,627,540 B1* | 4/2017 | Chen ................ H01L 29/66795 |
| 10,192,819 B1 | 1/2019 | Chanemougame |
| 10,332,803 B1 | 6/2019 | Xie |
| 2011/0254102 A1 | 10/2011 | Xiao et al. |
| 2015/0325481 A1 | 11/2015 | Radosavljevic et al. |
| 2017/0154958 A1* | 6/2017 | Fung ................ H01L 29/42392 |
| 2019/0064457 A1 | 2/2019 | More |
| 2019/0148376 A1 | 5/2019 | Chanemougame |
| 2020/0006559 A1 | 1/2020 | Mehandru |
| 2020/0135729 A1 | 4/2020 | Ng |
| 2022/0336457 A1* | 10/2022 | Tseng ................ H01L 29/66795 |

\* cited by examiner

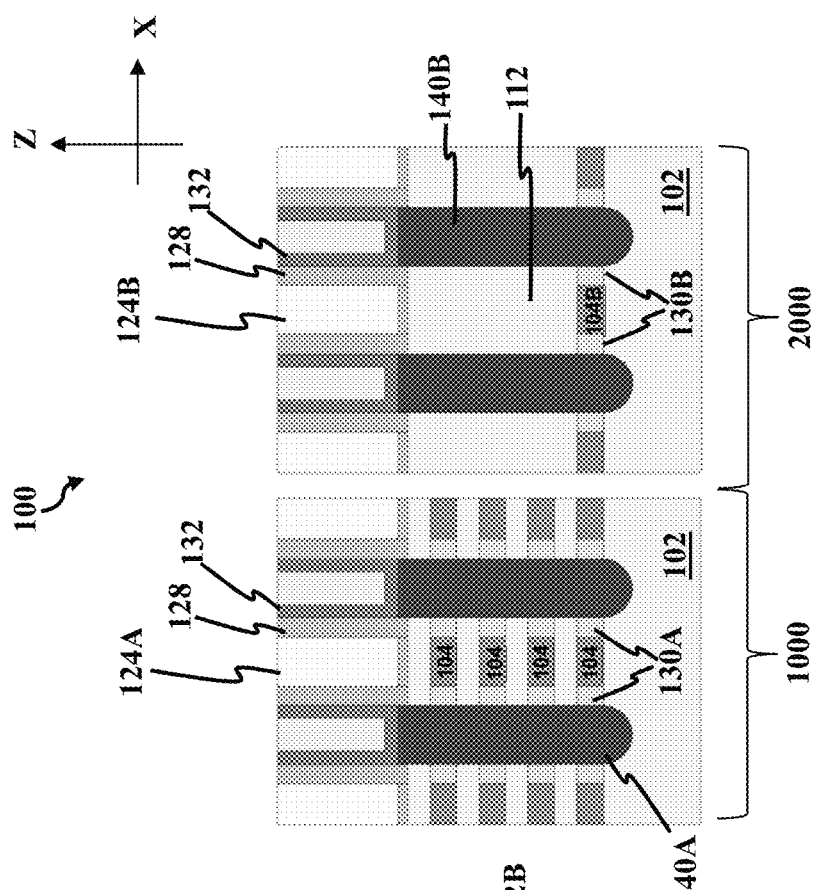
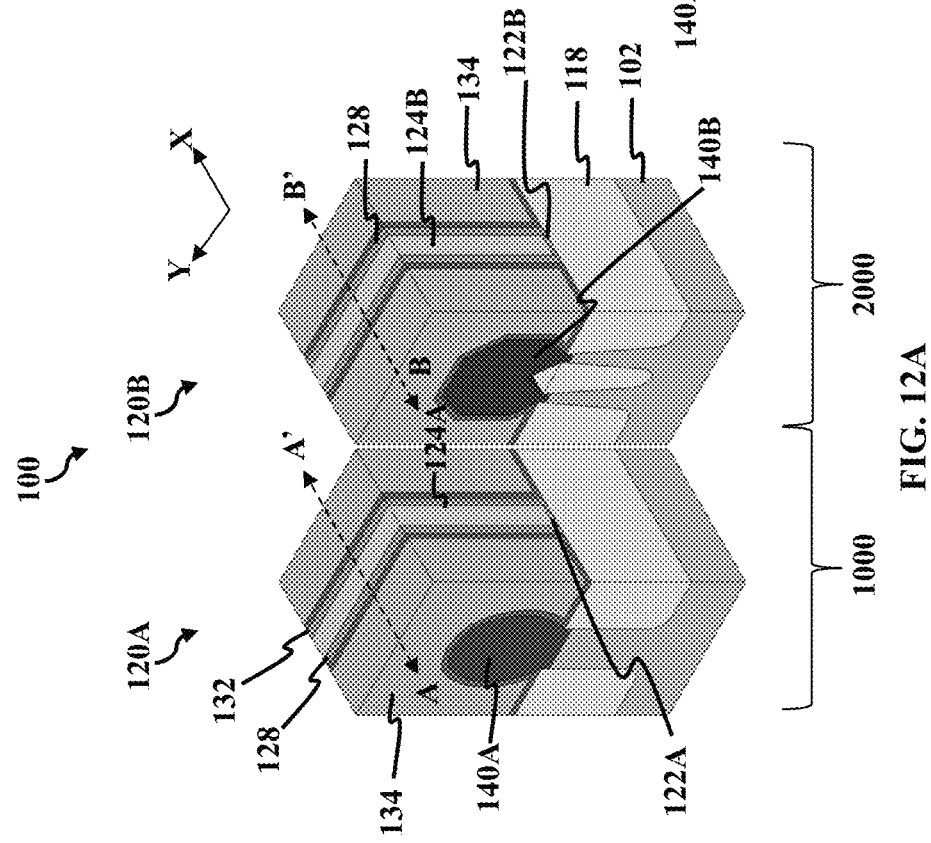
FIG. 12B
FIG. 12A

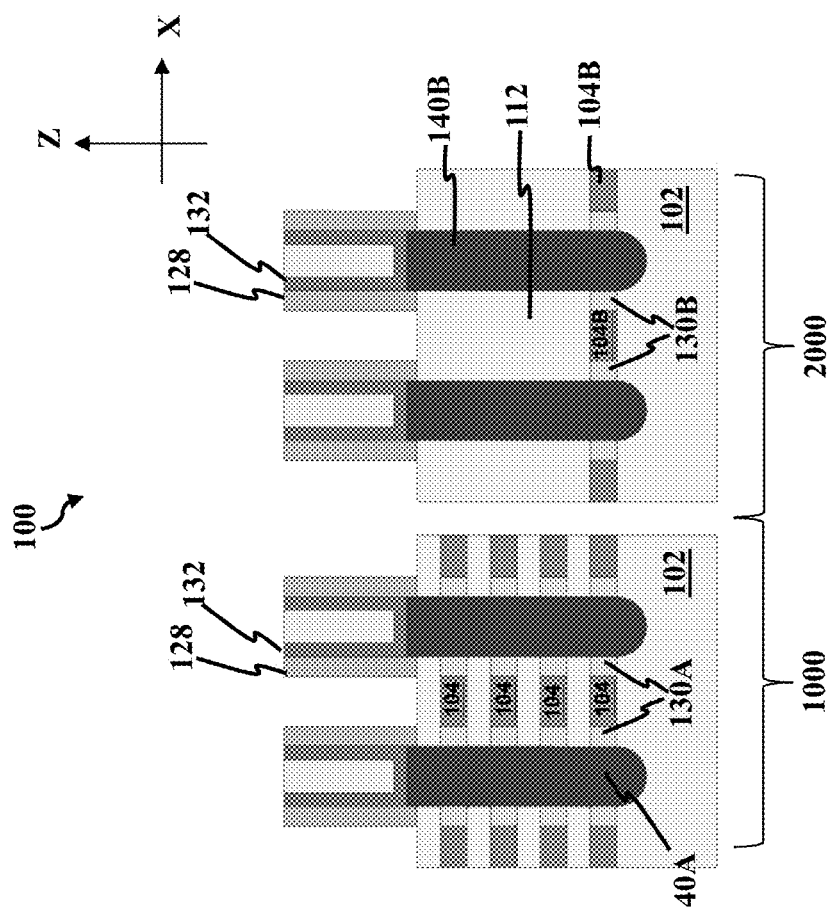
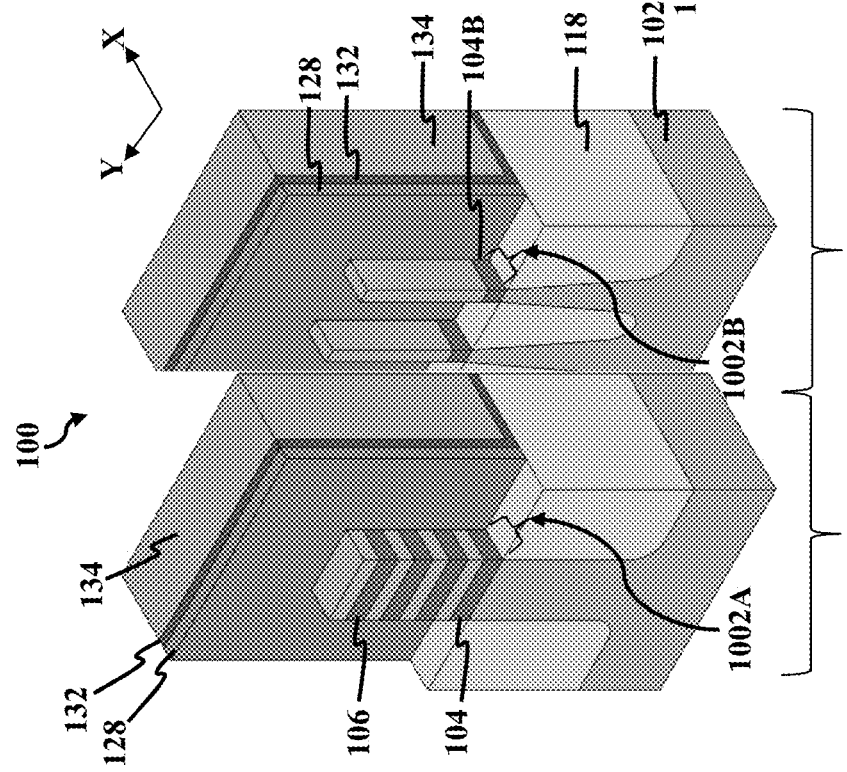
FIG. 13B
FIG. 13A

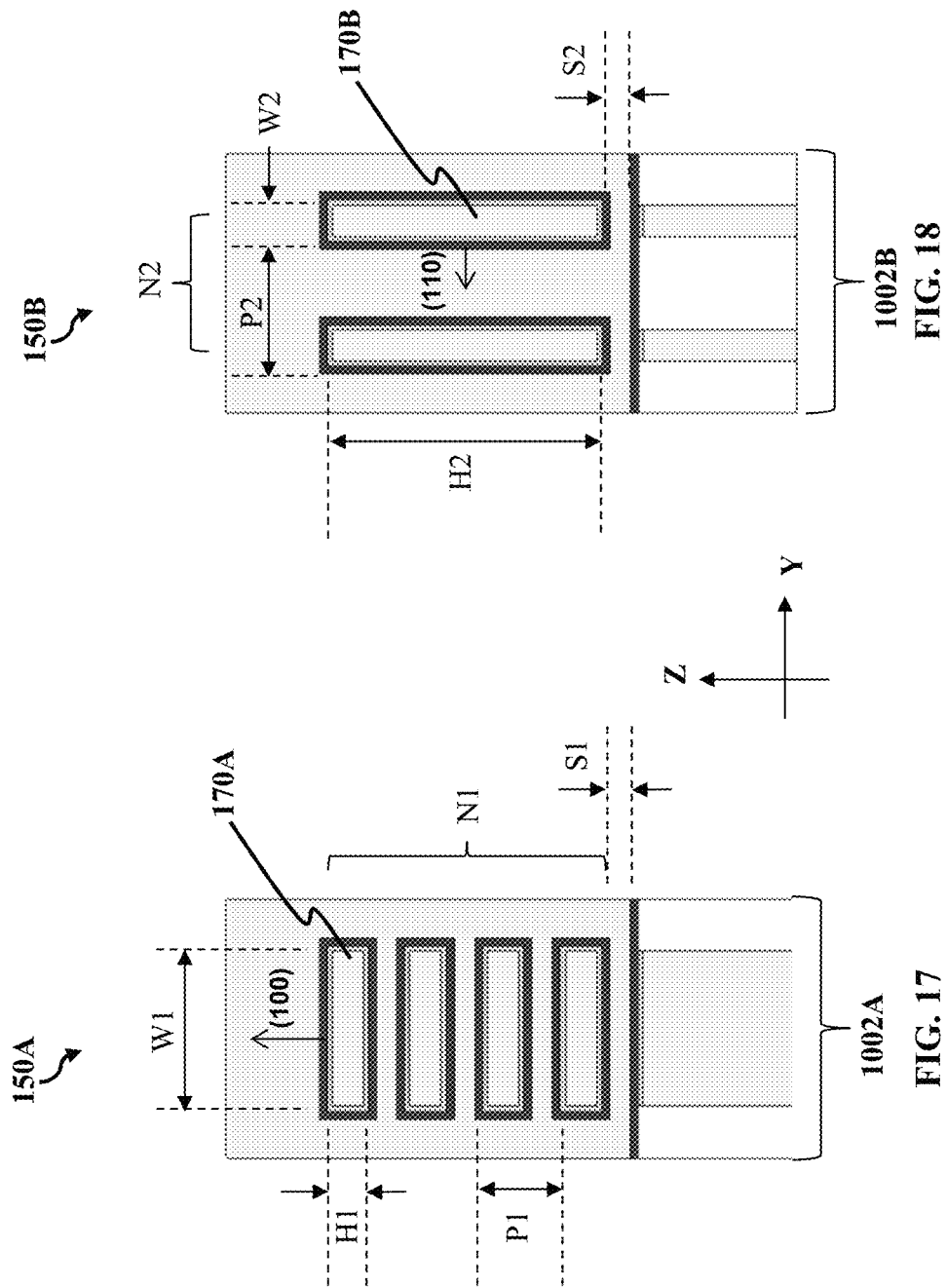

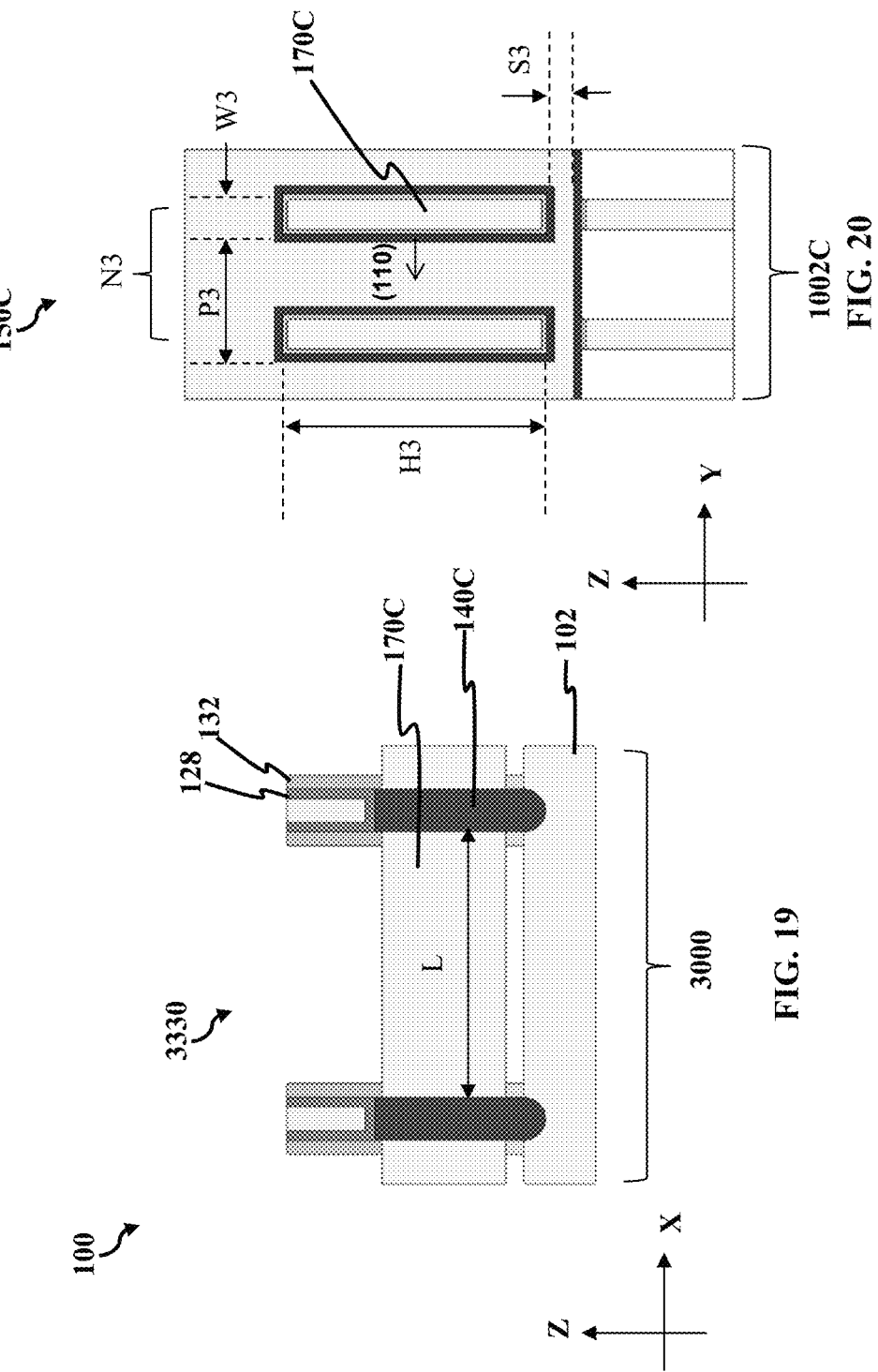

SEMICONDUCTOR DEVICES

PRIORITY DATA

This application is a divisional application of U.S. patent application Ser. No. 16/415,193, filed May 17, 2019, the entirety of which is incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and gate-all-around (GAA) transistors (both also referred to as non-planar transistors) are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). Compared to planar transistors, such configuration provides better control of the channel and drastically reduces SCEs (in particular, by reducing sub-threshold leakage (i.e., coupling between a source and a drain of the FinFET in the "off" state)). A GAA transistor has a gate structure that can extend, partially or fully, around a channel region to provide access to the channel region on two or more sides. The channel region of the GAA transistor may be formed from nanowires, nanosheets, other nanostructures, and/or other suitable structures. In some implementations, such channel region includes multiple nanowires or nanosheets that are vertically stacked or horizontally arranged. When vertically-stacked, the GAA transistor can be referred to as a vertical GAA (VGAA) transistor. When horizontally arranged, the GAA transistor can be referred to as a horizontal GAA (HGAA) transistor.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2-11, 12A, 12B, 13A, 13B, 14A, 14B, 15A, 15B, 16A, and 16B are perspective and cross-sectional views of GAA transistors on a workpiece at various fabrication stages, such as those associated with the method of FIG. 1, according to various aspects of the present disclosure.

FIG. 17 is a diagrammatic cross-sectional view of a channel region of a first type of GAA transistor according to various aspects of the present disclosure.

FIG. 18 is a diagrammatic cross-sectional view of a channel region of a second type of GAA transistor according to various aspects of the present disclosure.

FIG. 19 is a diagrammatic lateral view of a third type of GAA transistor.

FIG. 20 is a diagrammatic cross-sectional view of a third type of GAA transistor.

DETAILED DESCRIPTION

Figure 1:
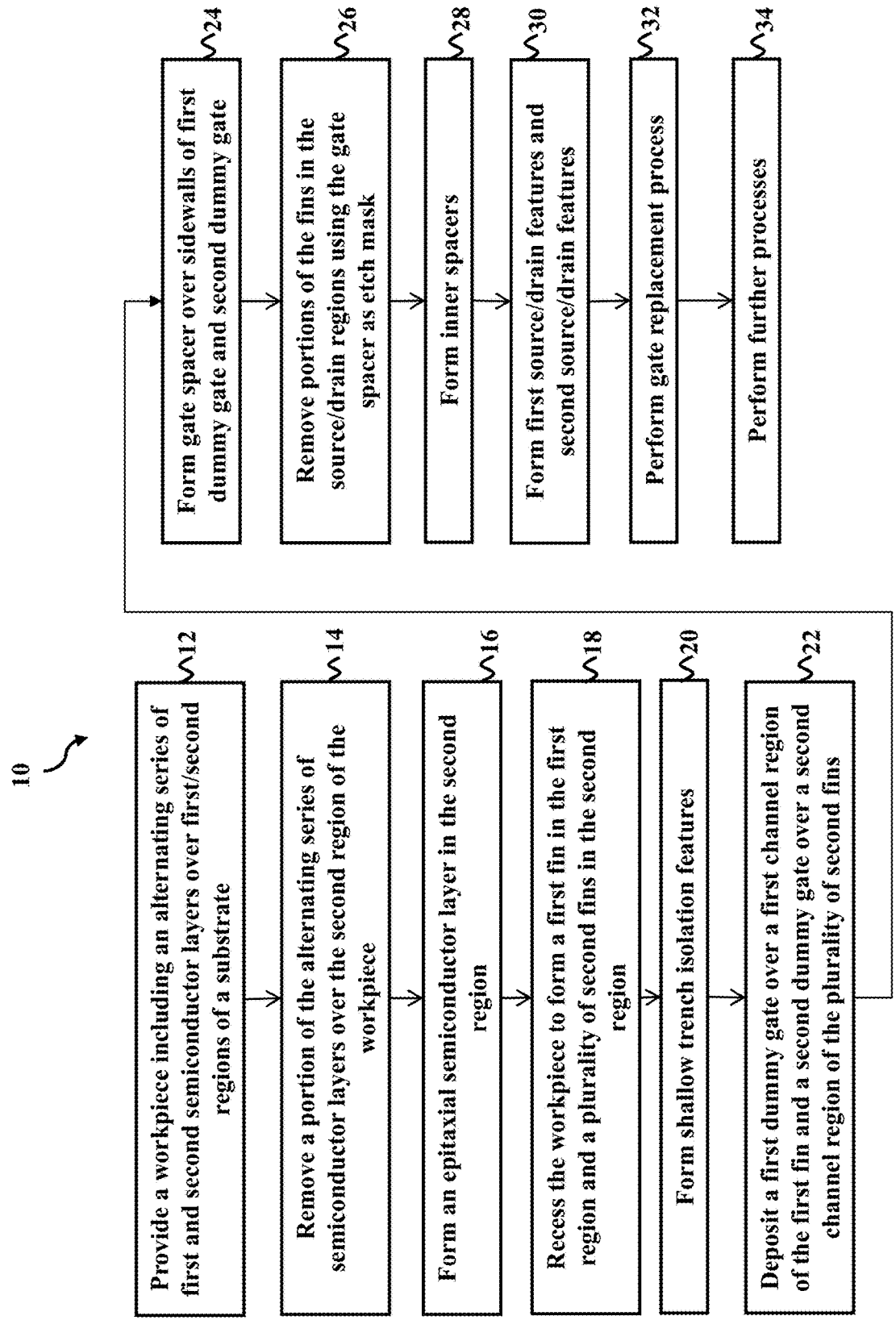
FIG. 1 is a flow chart of a method for fabricating GAA transistors according to various aspects of the present disclosure.

The present disclosure relates generally to integrated circuit devices, and more particularly, to GAA transistors.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Various methods for forming GAA transistors and related GAA transistors are disclosed herein. In some embodiments, the GAA transistors disclosed here may include N-type GAA transistors adjacent to P-type GAA transistors. These arrangements may be implemented in a variety of devices, including, for example, invertors, NAND logic gates, NOR logic gates, and oscillators. The present disclosure contemplates that one of ordinary skill may recognize other integrated circuit devices that can benefit from the GAA transistor formation methods and/or GAA transistors described herein.

FIG. 1 is a flow chart of a method 10 for fabricating GAA transistors. Method 10 will be described in conjunction with the diagrammatic perspective views and cross-sectional views shown in FIGS. 2-11, 12A, 12B, 13A, 13B, 14A, 14B, 15A, 15B, 16A, and 16B. Additional steps can be provided before, during, and after method 10, and some of the steps described can be moved, replaced, or eliminated for additional embodiments of method 10.

Figure 2:
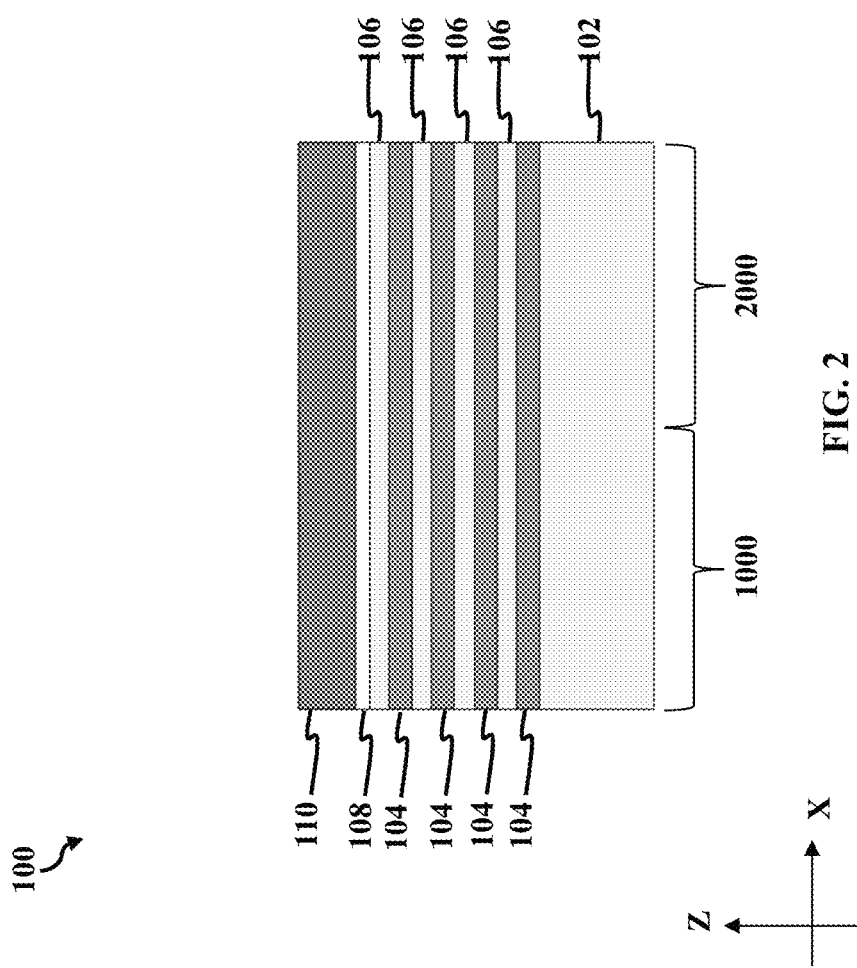

Reference is made to FIG. 1 and FIG. 2. Method 10 of the present disclosure starts with block 12 where a workpiece 100 is provided. The workpiece 100 includes an alternating series of first semiconductor layers 104 and second semiconductor layers 106 over a first region 1000 and a second region 2000 of a substrate 102. In some embodiments, the substrate 102 may be a semiconductor substrate, including, for example, silicon. Alternatively or additionally, substrate 102 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 102 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. p-type dopants and n-type dopants. In one embodiment, the substrate 102 consists of silicon or a silicon top surface and the silicon substrate or the silicon top surface has a (100) crystal plane with a normal direction parallel to the Z-direction. As will be described below, when channels are formed in the first region 1000 and the second region 2000, the channels have channel lengths along the crystal direction [110] parallel to the Y-direction.

In some embodiments, each of the first semiconductor layers 104 comprises silicon and germanium. In some instances, each of the first semiconductor layers 104 consists essentially of silicon and germanium. In these embodiments, each of the second semiconductor layers 106 comprises silicon. In some instances, each of the second semiconductor layers 106 consists essentially of silicon. In some implementations, the first semiconductor layers 104 and the second semiconductor layers 106 may be formed or deposited using an epitaxy process. The epitaxy process may include vapor-phase epitaxy (VPE), molecular beam epitaxy (MBE), other suitable epitaxy processes, or combinations thereof. In some embodiments, between 2 and 20 first semiconductor layers 104 and between 2 and 20 second semiconductor layers 106 may be formed at block 12. In one embodiment, the alternating series of first semiconductor layers 104 and the second semiconductor layers 106 starts with one of the first semiconductor layers 104 on the substrate 102. In some instances, because the alternating series of first semiconductor layers 104 and second semiconductor layers 106 are formed one after another on the substrate 102, they share the same crystal plane (100) parallel to the Z-direction.

In some embodiments, the workpiece 100 may include one or more hard mask layers deposited over the alternating series of first semiconductor layers 104 and the second semiconductor layers 106 for operations at block 14. In some implementations represented in FIG. 2, the workpiece 100 includes a first hard mask layer 108 and a second hard mask layer 110. In some embodiments, the first hard mask layer 108 includes silicon nitride, silicon carbide, silicon oxycarbide, and silicon oxynitride and the second hard mask layer 110 may include silicon oxide.

Figure 3:
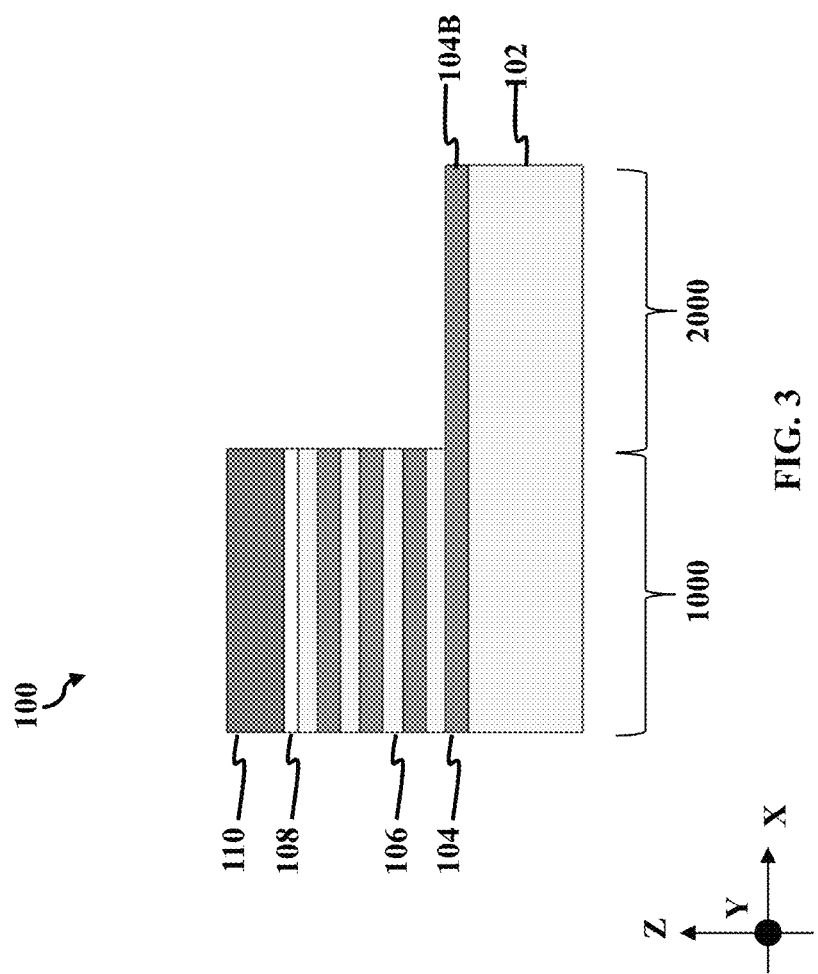

Reference is now made to FIGS. 1 and 3. The method 10 proceeds to block 14 where a portion of the alternating series of first semiconductor layers 104 and second semiconductor layers 106 is removed in the second region 2000 of the workpiece 100. In some implementations, the removal is carried out using a dry etching process (for example, a reactive ion etching (RIE) process), a wet etching process, other suitable etching process, or combinations thereof. For example, a photoresist layer may be deposited over the second hard mask layer 110 for patterning of the underlying first and second hard mask layers 108 and 110, and the patterned first and second hard mask layers 108 and 110 are used as mask for selective removal of the alternating series of first semiconductor layers 104 and second semiconductor layers 106 in the second region 2000. In some embodiments, the removal is performed using a dry etching process that is anisotropic (directional) and easy to control by etching time. In one embodiment represented in FIG. 3, the removal is timed such that one bottom first semiconductor layer 104B is left on the substrate 102 in the second region 2000. In another embodiment, the entirety of the alternating series of first semiconductor layers 104 and the second semiconductor layers 106 is removed from the second region 2000 and a bottom first semiconductor layer 104B is deposited anew on the substrate 102 in the second region 2000. Therefore, for purposes of the present disclosure, the bottom first semiconductor layer 104B may be the bottom first semiconductor layer 104B left on the substrate 102 or a newly deposited bottom first semiconductor layer 104B after the alternating series of first semiconductor layers 104 and second semiconductor layers 106 are removed from the second region 2000.

Figure 4:
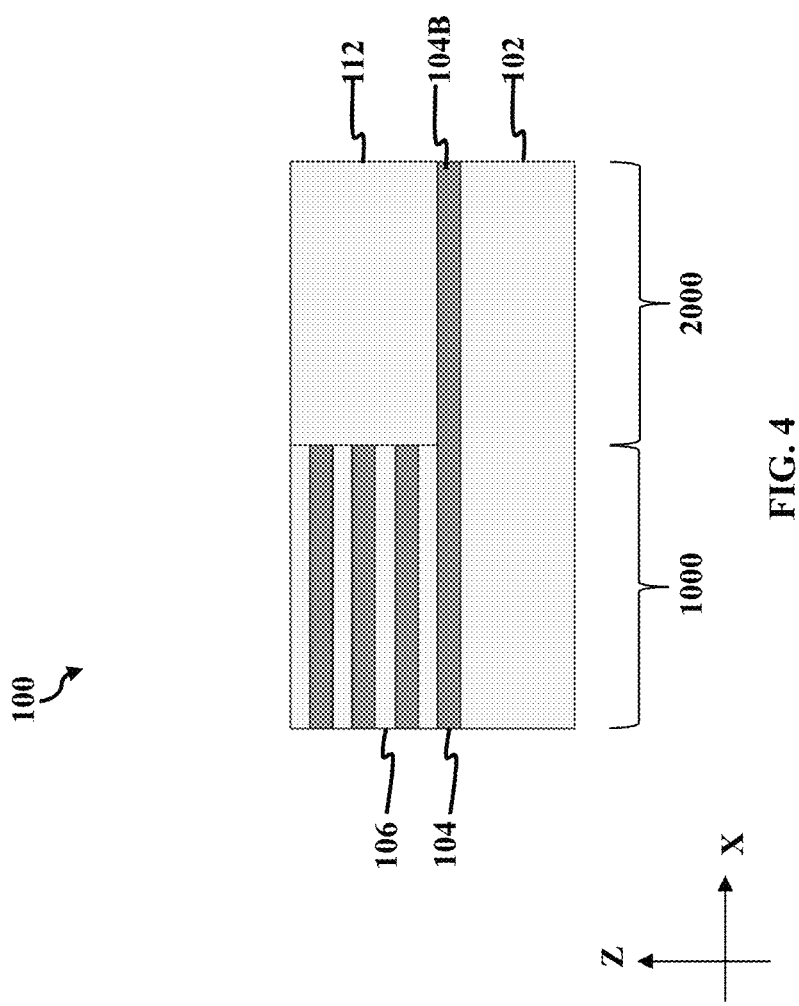

Reference is now made to FIGS. 1 and 4. The method 10 proceeds to block 16 where an epitaxial semiconductor layer 112 is formed in the second region 2000. In some embodiments, the epitaxial semiconductor layer 112 may be deposited using vapor-phase epitaxy (VPE), molecular beam epitaxy (MBE), other suitable epitaxy processes, or combinations thereof. In some implementations, after the epitaxial semiconductor layer 112 is deposited, a planarizing process, such as grinding or chemical mechanical polishing (CMP), may be performed to provide a planar top surface of the workpiece 100. In some embodiments, the epitaxial semiconductor layer 112 may include silicon. In some instances, the epitaxial semiconductor layer 112 may consists essentially of silicon.

Figure 5:
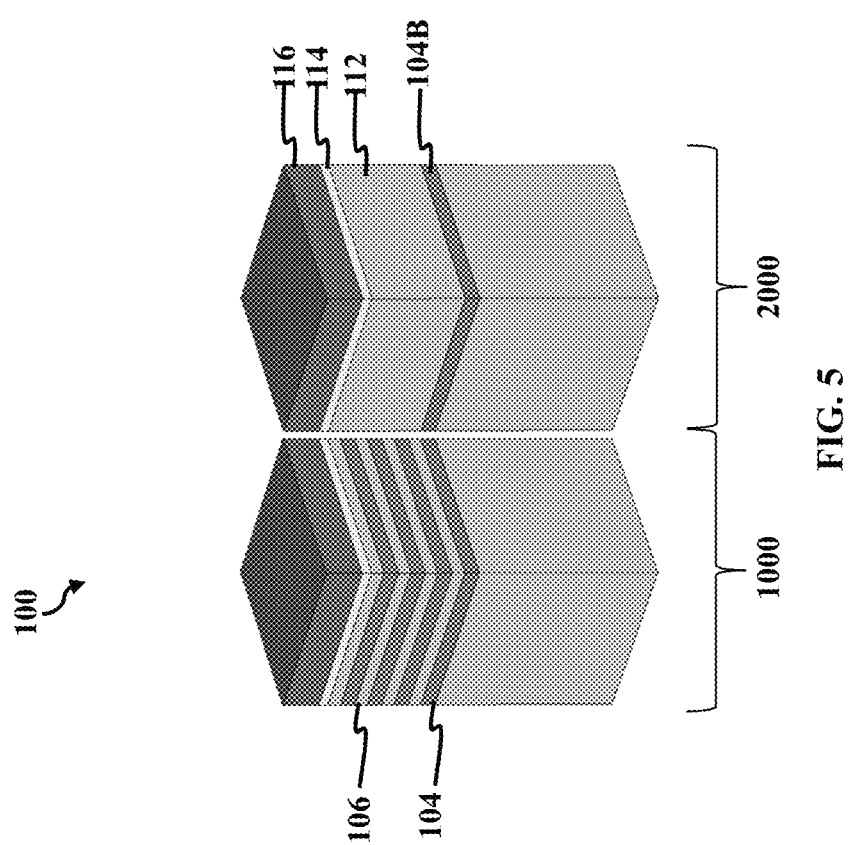
Figure 6:
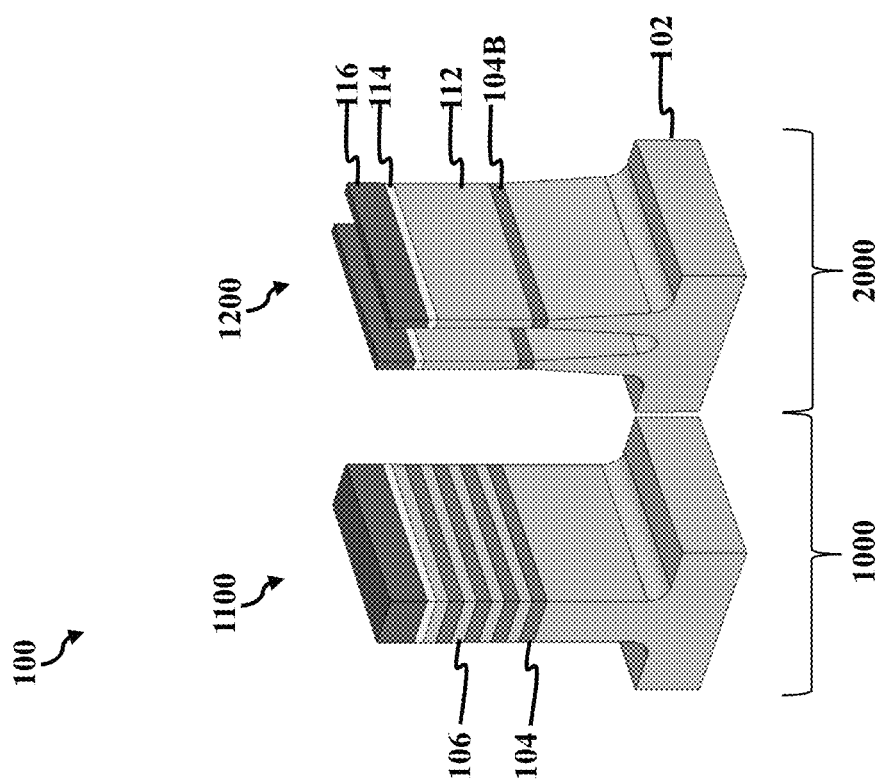

Referring now to FIGS. 1, 5 and 6, the method 10 proceeds to block 18 where the workpiece 100 is recessed to form a first fin 1100 in the first region 1000 and a plurality of second fins 1200 in the second region 2000, along with trenches between these fins. The plurality of second fins 1200 may include 2 to 50 second fins. In some embodiments, at block 18, a third hard mask layer 114 and a fourth hard mask layer 116 are formed on the planarized top surface of the workpiece 100, including over the alternating series of first semiconductor layers 104 and second semiconductor layers 106 in the first region 1000 and the epitaxial semiconductor layer 112 in the second region 2000. In some embodiments, the third hard mask layer 114 includes silicon nitride, silicon carbide, silicon oxycarbide, and silicon oxynitride and the fourth hard mask layer 116 may include silicon oxide. A photoresist is then deposited over the fourth hard mask layer 116. The photoresist layer, the third hard mask layer 114 and the fourth hard mask layer 116 are then patterned to serve as a patterned mask for recessing the workpiece 100. In some embodiments, the workpiece 100 is recessed to form one first fin 1100 in the first region 1000 and two second fins 1200 in the second region 2000. In some embodiments represented in FIG. 6, at block 18, not only the alternating layers of first semiconductor layers 104 and second semiconductor layers 106 and the epitaxial semiconductor layer 112 are recessed, the substrate 102 below the alternating series of semiconductor layers in the first region 1000 and below the bottom first semiconductor layer 104B in the second region 2000 is also recessed.

Figure 7:
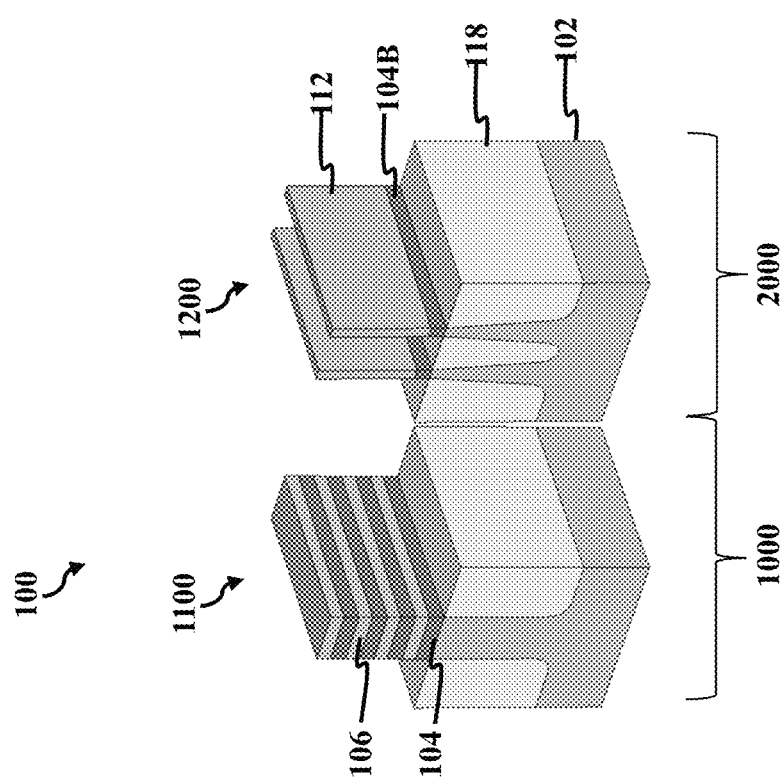

Reference is now made to FIGS. 1 and 7. The method 10 proceeds to block 20 where isolation features 118 are formed. In some implementations, trenches formed at block 18 are filled with insulator material to form the isolation features. Isolation features 118 may include silicon oxide, silicon nitride, silicon oxynitride, other suitable isolation material (for example, including silicon, oxygen, nitrogen, carbon, or other suitable isolation constituent), or combinations thereof. The isolation features 118 shown in FIG. 7 may be referred to as shallow trench isolation (STI) features. In some implementations, isolation features 118 are formed by filling the trench (formed at block 18) with insulator material (for example, using a chemical vapor deposition process or a spin-on glass process). In some embodiments, isolation material filled in the trenches may be etched back using suitable etchant and etching processes.

Figure 8:
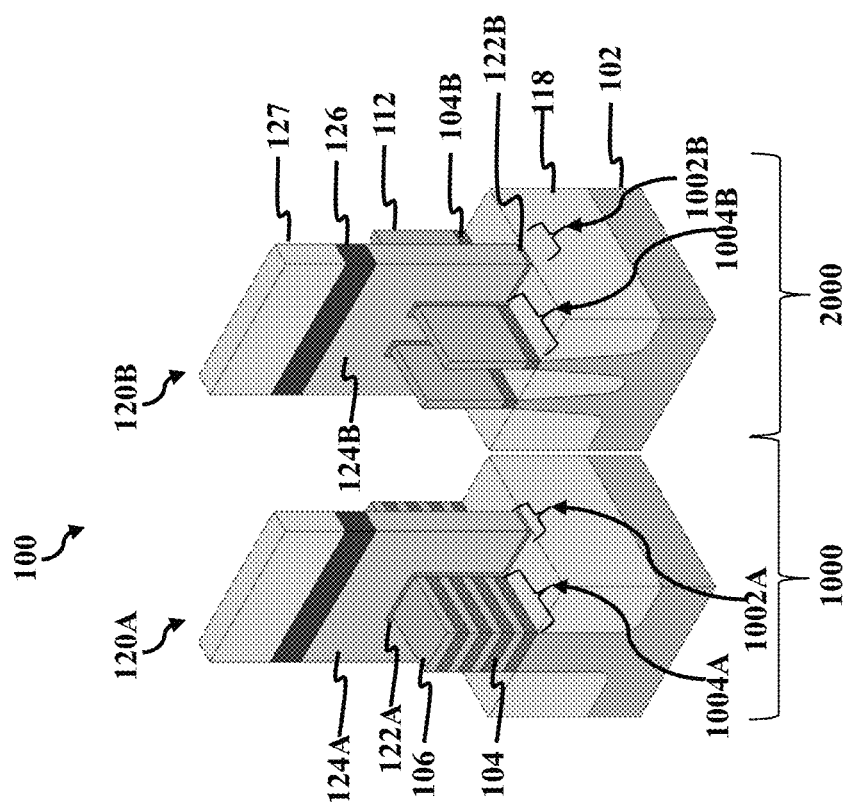

Referring now to FIGS. 1 and 8, the method 10 proceeds to block 22 where a first dummy gate stack 120A is deposited over a first channel region 1002A of the first fin 1100 and a second dummy gate stack 120B is deposited over a second channel region 1002B of the plurality of second fins 1200. The first dummy gate stack 120A and the second dummy gate stack 120B may include a multi-layer structure. In the embodiments represented in FIG. 8, the first dummy gate stack 120A includes a dummy gate dielectric layer 122A and a dummy gate electrode layer 124A; and the second dummy gate stack 120B includes a dummy gate dielectric layer 122B and a dummy gate electrode layer 124B. A fifth hard mask layer 126 and a sixth hard mask layer 127 may be deposited over the first and second dummy gate stacks 120A and 120B to for protection thereof and subsequent patterning. In some implementations, the dummy gate dielectric layers 122A and 122B may include silicon oxide or other suitable dielectric material. The dummy gate electrode layers 124A and 124B may include polysilicon. In some embodiments, the fifth hard mask layer 126 includes silicon nitride, silicon carbide, silicon oxycarbide, and silicon oxynitride and the sixth hard mask layer 127 may include silicon oxide. The first and second dummy gate stacks 120A and 120B may be formed by deposition processes, lithography processes, etching processes, other suitable processes, or combinations thereof. For example, one or more deposition processes may be performed to form a dummy gate dielectric layer over the first fin 1100 and the plurality of second fins 1200 in their respective first and second channel regions 1002A and 1002B. A deposition process is then performed to form the first and second dummy gate electrode layers over the first and second dummy gate dielectric layers. The deposition processes include CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. A lithography patterning and etching process is then performed to pattern the dummy gate dielectric layers and a dummy gate electrode layers to form the first dummy gate stack 120A and the second dummy gate stack 120B. The lithography patterning processes include resist coating (for example, spin-on coating), soft baking, mask aligning, exposure, post-exposure baking, developing the resist, rinsing, drying (for example, hard baking), other suitable processes, or combinations thereof. Alternatively, the lithography exposing process is assisted, implemented, or replaced by other methods, such as maskless lithography, electron-beam writing, or ion-beam writing. In yet another alternative, the lithography patterning process implements nano-imprint technology. The etching processes include dry etching processes, wet etching processes, other etching methods, or combinations thereof.

Figure 9:
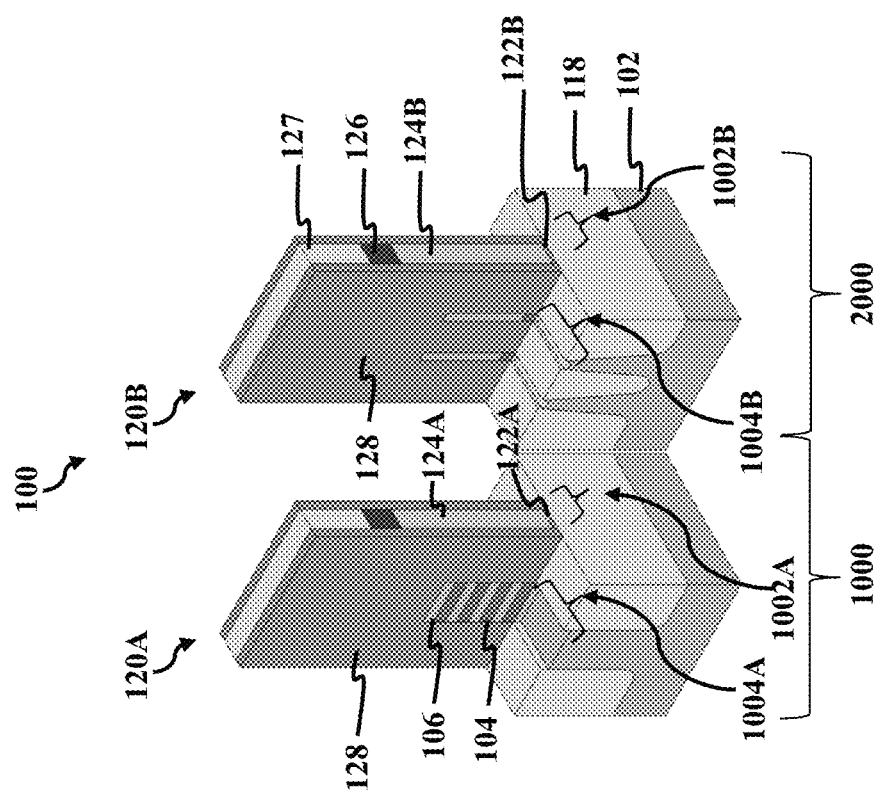

Reference is now made to FIGS. 1 and 9. The method 10 proceeds to block 24 where gate spacers 128 are formed over sidewalls of the first dummy gate stack 120A and the second dummy gate stack 120B. The gate spacers 128 are formed by any suitable process and include a dielectric material. The dielectric material can include silicon, oxygen, carbon, nitrogen, other suitable material, or combinations thereof (for example, silicon oxide, silicon nitride, silicon oxynitride, or silicon carbide). For example, in the depicted embodiment, a dielectric layer including silicon and nitrogen, such as a silicon nitride layer, can be deposited over workpiece 100 and subsequently anisotropically etched to form gate spacers 128. In some implementations, gate spacers 128 include a multi-layer structure, such as a first dielectric layer that includes silicon nitride and a second dielectric layer that includes silicon oxide. In some implementations, more than one set of spacers, such as seal spacers, offset spacers, sacrificial spacers, dummy spacers, and/or main spacers, are formed adjacent to the dummy gate stacks 120A and 120B. In such implementations, the various sets of spacers can include materials having different etch rates. For example, a first dielectric layer including silicon and oxygen (for example, silicon oxide) can be deposited over workpiece 100 and subsequently anisotropically etched to form a first spacer set adjacent to the gate stacks, and a second dielectric layer including silicon and nitrogen (for example, silicon nitride) can be deposited over workpiece 100 and subsequently anisotropically etched to form a second spacer set adjacent to the first spacer set.

Referring now to FIGS. 1 and 9, the method 10 proceeds to block 26 where portions of the first and second fins in their respective source/drain regions are removed using the gate spacers 128 as an etch mask. In some embodiments, because the type of the transistor is determined not by dopant types in the first channel region 1002A and the second channel region 1002B, but by dopant types in the source/drain regions, the portions of the first fin 1100 and the plurality of second fins 1200 outside the first channel region 1002A and the second channel region 1002B are substantially or completely removed such that source/drain features can be regrown epitaxially anew with dopants in a later step. The selective removal of the first fin 1100 and the plurality of second fins 1200 is achieved by etching using the gate spacers 128 as an etch mask. The etching processes that may be used at block 26 include dry etching processes, wet etching processes, other etching methods, or combinations thereof.

Figure 10:
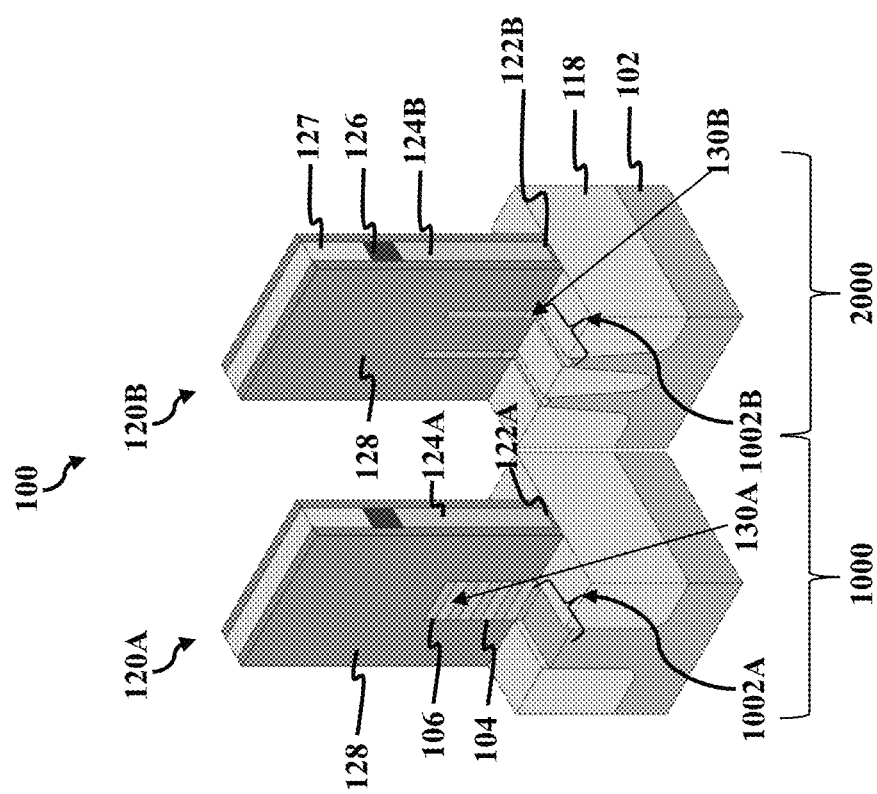

Reference is now made to FIGS. 1 and 10. The method 10 proceeds to block 28 where first inner spacers 130A are formed on both ends of each of the first semiconductor layers 104 in the first region 1000 and second inner spacers 130B are formed on both ends of the bottom first semiconductor layer 104B in the second region 2000. In the embodiments represented in FIG. 10, because the second inner spacers 130B are only formed on both ends of the bottom first semiconductor layer 104B, the topmost second inner spacers 130B in the second region 2000 is positioned lower the topmost first inner spacers 130A in the first region 1000.

In some embodiments, the first and second inner spacers 130A and 130B may be formed in a self-aligned manner. For example, when the first semiconductor layers 104 are formed of silicon germanium (SiGe), the first semiconductor layers 104 (or 104B for the second region 2000) may be exposed to water and a low oxidation temperature (lower than the temperature required to oxidize silicon) to form SiGe Oxide. The inner spacers may prevent source/drain features from being etched in the gate replacement process at block 32. Alternatively, the inner spacers may be formed of low-K dielectric to lower parasitic capacitance.

Figure 11:
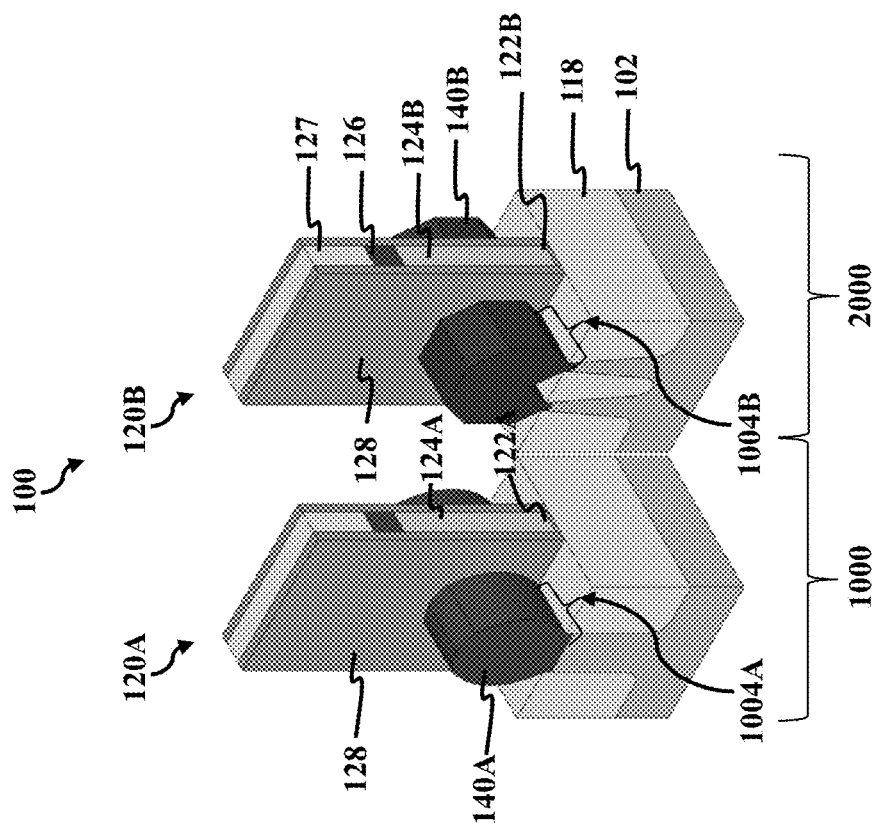

Reference is now made to FIGS. 1 and 11. The method 10 proceeds to block 30 where first source/drain features 140A are formed in the first region 1000 and second source/drain features 140B are formed in the second region 2000. In some embodiments, an N-doped semiconductor material is epitaxially grown in the first source/drain regions 1004A in the first region 1000 to form the first source/drain features 140A after the portion of the first fin 1100 in the first source/drain region 1004A is substantially removed. Similarly, a P-doped semiconductor material is epitaxially grown in the second source/drain regions 1004B in the second region 2000 to form the second source/drain features 140B after the portion of the plurality of second fins 1200 in the second source/drain region 1004B is substantially removed. In alternative embodiments, the fin structures in the source/drain regions 1004A and 1004B are not completely removed and the N-doped and P-doped semiconductor materials are epitaxially grown over the fin structures to wrap around the fin structures. An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors, which interact with the composition of fin structures, such as the first fin 1100 and the plurality of second fins 1200. In some implementations, the N-doped semiconductor material may be epitaxially grown silicon doped in-site or by implantation with one or more N-type dopants, such as phosphorous, arsenic, other N-type dopant, or combinations thereof and the P-doped semiconductor material may be epitaxially grown silicon germanium doped in-site or by implantation with one or more P-type dopants, such as boron, gallium, other P-type dopant, or combinations thereof. In one embodiment, the N-doped semiconductor material is silicon doped in-situ with phosphorous and the P-doped semiconductor material is silicon germanium doped in-site with boron.

FIGS. 12A, 12B, 13A, 13B, 14A, 14B, 15A, 15B, 16A, and 16B will be referred in the following description of the embodiments of the present disclosure. Each of FIGS. 12B, 13B, 14B, 15B, and 16B illustrate cross-sectional views taken along lines A-A' and B-B' shown in FIG. 12A. In some of these figures, lines A-A' and B-B' may not be illustrated for clarity of illustration.

Reference is now made to FIGS. 12A and 12B. While not illustrated as a separate block in the method 10 shown in FIG. 1, a dielectric layer 134 is formed over the first and second source/drain features 140A and 140B. In some implementations, the dielectric layer 134 may be referred to as an interlevel dielectric (ILD, or interlayer dielectric) layer 120. In some implementations, ILD layer 134 is a portion of a multilayer interconnect (MLI) feature that electrically couples various devices (for example, transistors, resistors, capacitors, and/or inductors) and/or components (for example, gate structures and/or source/drain features) of devices to be formed on the workpiece 100, such that the various devices and/or components can operate as specified by design requirements of the devices on the workpiece 100. ILD layer 134 includes a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, other low-k dielectric material, or combinations thereof. In some implementations, ILD layer 134 may have a multilayer structure having multiple dielectric materials. In some implementations, a contact etch stop layer (CESL) 132 is disposed between ILD layer 134, on the one hand, and fin structures (the first fin 1100 and the plurality of second fins 1200) and/or first and second source/drain features 140A and 140B, on the other. The CESL 132 includes a material different than ILD layer 134, such as a dielectric material that is different than the dielectric material of ILD layer 134. In the depicted embodiment, where ILD layer 134 includes a low-k dielectric material, the CESL 132 includes silicon and nitrogen (for example, silicon nitride or silicon oxynitride). ILD layer 134 and the CESL 132 may be formed over the workpiece 100, for example, by a deposition process (such as CVD, PVD, ALD, HDPCVD, MOCVD, RPCVD, PECVD, LPCVD, ALCVD, APCVD, plating, other suitable methods, or combinations thereof). In some implementations, ILD layer 134 and the CESL 132 may be formed by a flowable CVD (FCVD) process that includes, for example, depositing a flowable material (such as a liquid compound) over the workpiece 100 and converting the flowable material to a solid material by a suitable technique, such as thermal annealing and/or ultraviolet radiation treating. Subsequent to the deposition of ILD layer 134 and/or the CESL 132, a CMP process and/or other planarization process is performed, such that a top portion of dummy gate electrode layer 124A and 124B is reached (exposed). In the depicted embodiment, top surfaces of dummy gate electrode layers 124A and 124B are substantially planar with a top surface of ILD layer 134.

Figure 14B:
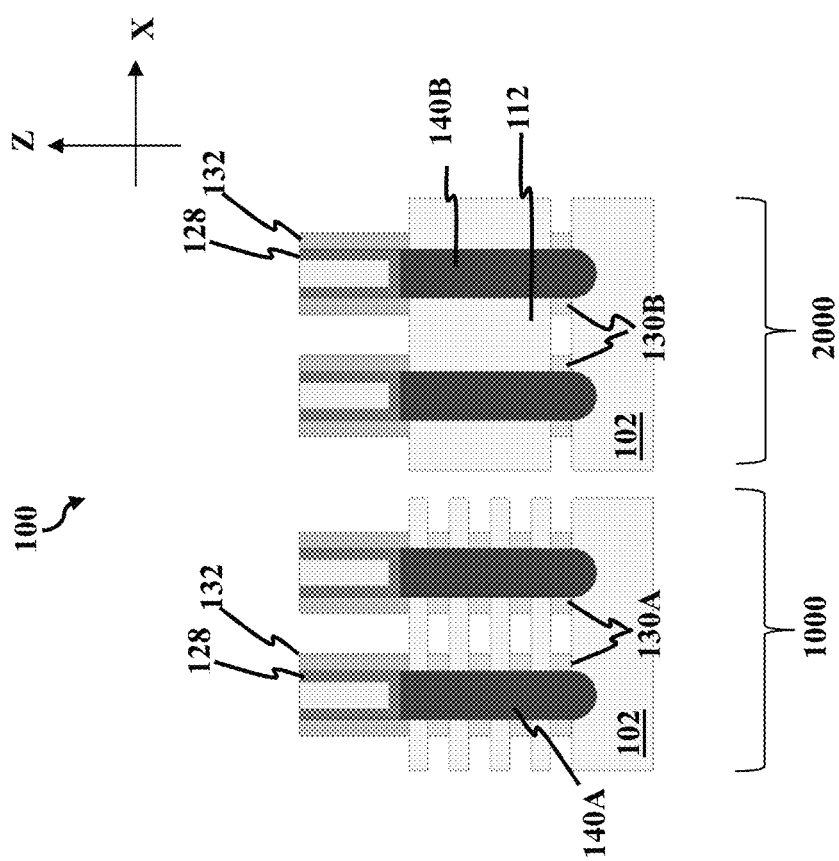
Figure 14A:
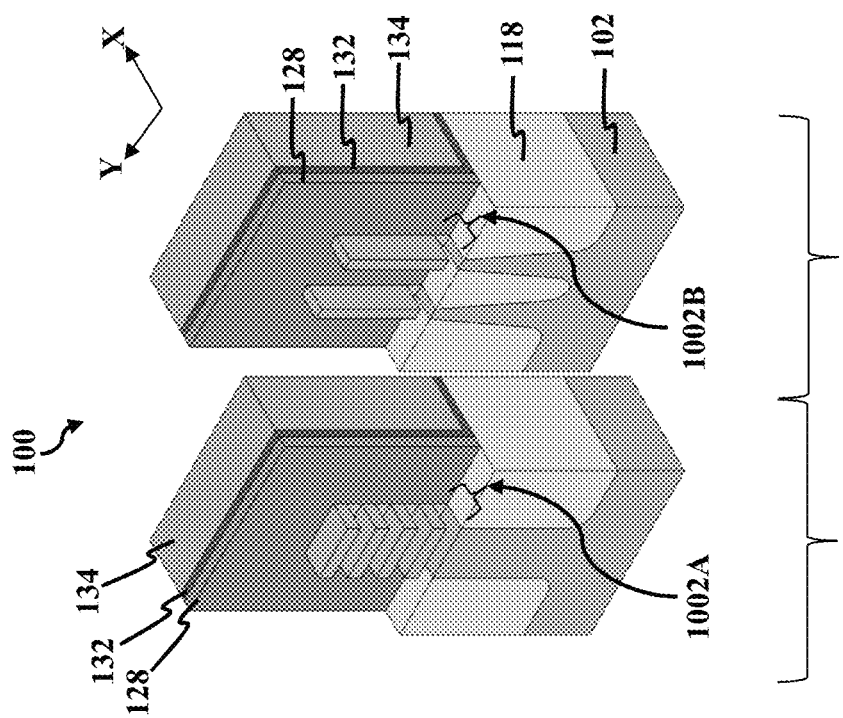
Figures 15A, 15B:
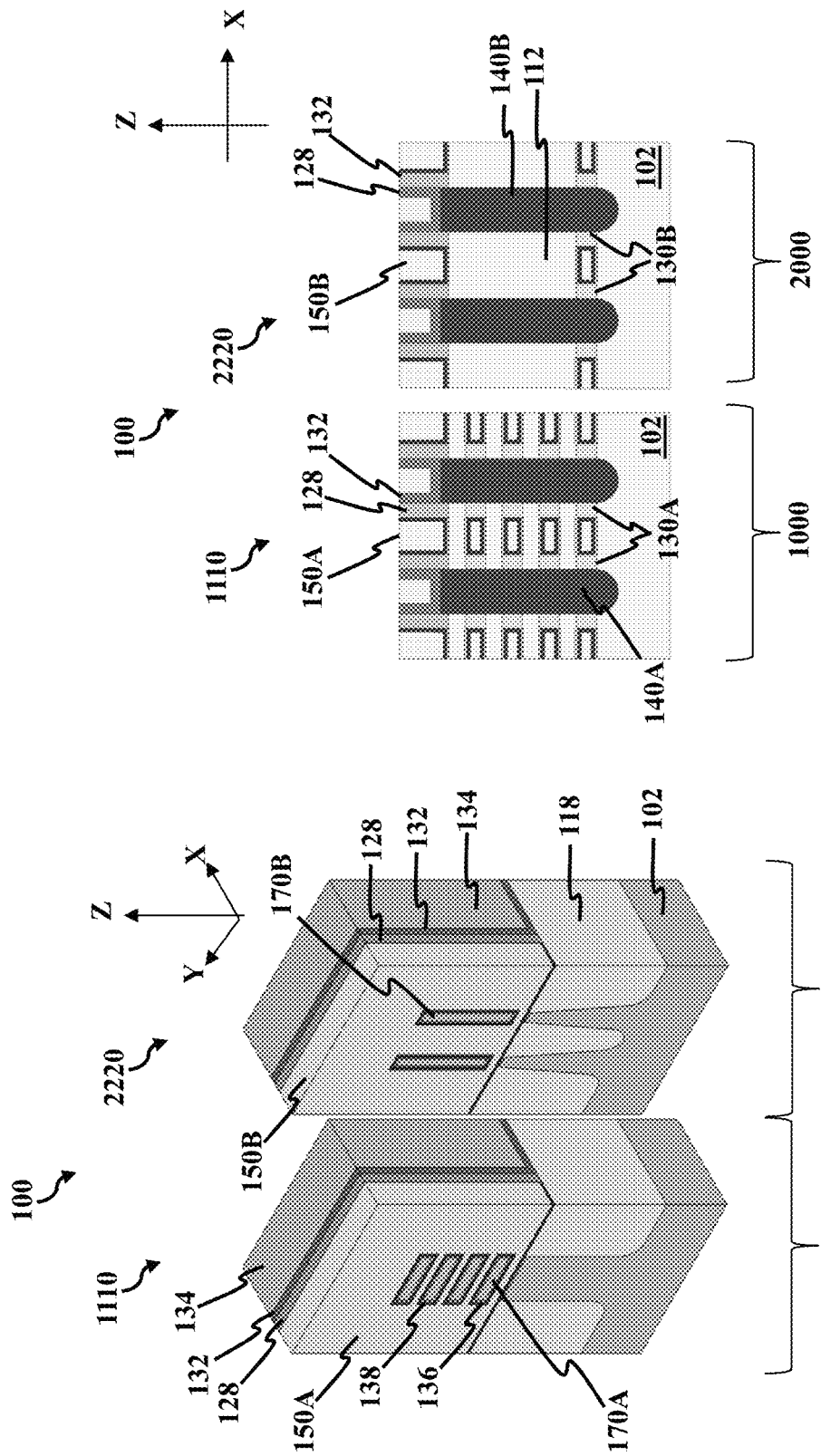

Referring now to FIGS. 1, 13A, 13B, 14A, 14B, 15A, and 15B, the method 10 proceeds to block 32 where a gate replacement process is performed to replace the first dummy gate stack 120A and the second dummy gate stack 120B with first gate stack 150A and the second gate stack 150B, respectively. In some embodiments, as shown in FIGS. 13A and 13B, the first dummy gate stack 120A and the second dummy gate stack 120B are first removed by selective etching to expose the first and second channel regions 1002A and 1002B. Then, as shown in FIGS. 14A and 14B, the first semiconductor layers 104 and the bottom first semiconductor layer 104B are then removed by a dry etching process, a wet etching, other suitable etching process, or a combination thereof. After the first semiconductor layers 104 and the bottom first semiconductor layer 104B are removed, the remaining second semiconductor layers 106 and the epitaxial semiconductor layer 112 in the plurality of second fins 1200 are left in place substantially unetched to serve as the channels (or channel members) for the GAA transistors in the first and second regions 1000 and 2000. An interfacial layer 136 is then formed over the first channel region 1002A and the second channel region 1002B. A high-K dielectric 138 is formed over the interfacial layer 136. The interfacial layer 136 may enhance the bonding of high-K dielectric 138 to the second semiconductor layers 106 and the epitaxial semiconductor layer 112. In some implementations, the interfacial layer 136 may include silicon oxide and the high-K dielectric 138 may include a high-k dielectric material (and thus may be referred to as a high-k dielectric layer), such as hafnium dioxide (HfO$_2$), HfSiO, HfSiON, HfaO, HfTiO, HfZrO, zirconium oxide, aluminum oxide, hafnium dioxide-alumina (HfO$_2$—Al$_2$O$_3$) alloy, other suitable high-k dielectric material, or combinations thereof. High-k dielectric material generally refers to dielectric materials having a high dielectric constant, for example, greater than that of silicon oxide (k≈3.9). The high-K dielectric 138 may be formed using, for example, an ALD process to conformally deposits gate dielectric material over the first and second channel regions 1002A and 1002B, such that high-K dielectric 138 has a substantially uniform thickness. Alternatively, the high-K dielectric 138 is formed using another suitable deposition process, such as CVD, PVD, HDPCVD, MOCVD, RPCVD, PECVD, LPCVD, ALCVD, APCVD, spin coating, plating, other deposition process, or combinations thereof. In some instances, the interfacial layer 136 and the high-K dielectric 138 may be referred collectively as a gate dielectric layer.

After the gate dielectric layer is formed, a first gate stack 150A is formed in the first region 1000 and the second gate stack 150B is formed in the second region 2000. The first and second gate stacks 150A and 150B may be deposited in the first and second channel regions 1002A and 1002B, respectively to wrap around the gate dielectric layers and channels (or channel members) therein. The first and second gate stacks 150A and 150B may include multiple layers, such as a capping layer, one or more work function layers, a glue layer, and a metal fill layer. The capping layer may be deposited using, for example, an ALD process. In some implementations, the capping layer may have a total thickness of about 5 Å to about 25 Å and may include a material that prevents or eliminates diffusion and/or reaction of constituents between gate dielectric layer and other layers of first and second gate stacks 150A and 150B (in particular, gate layers including metal). In some implementation, the capping layer includes a metal and nitrogen, such as titanium nitride (TiN), tantalum nitride (TaN), tungsten nitride (W$_2$N), titanium silicon nitride (TiSiN), tantalum silicon nitride (TaSiN), or combinations thereof. For example, in the depicted embodiment, the capping layer includes titanium and nitrogen (for example, TiN). Alternatively, the capping layer may be formed using another suitable deposition process, such as CVD, PVD, HDPCVD, MOCVD, RPCVD, PECVD, LPCVD, ALCVD, APCVD, spin coating, plating, other deposition process, or combinations thereof. In some embodiments, one or more N-type work function layers may be formed over the capping layer in the first region 1000 and one or more P-type work function layers may be formed over the capping layer in the second region 2000. In some implementations, the thicknesses of the work function layers may be increased or reduced to adjust for different threshold voltages of design.

The one or more P-type work function layers may include any suitable p-type work function material, such as TiN, TaN, Ru, Mo, Al, WN, ZrSi$_2$, MoSi$_2$, TaSi$_2$, NiSi$_2$, WN, other p-type work function material, or combinations thereof. In the depicted embodiment, the one or more P-type work function layers include titanium and nitrogen, such as TiN. The one or more P-type work function layers may be formed using a suitable deposition process, such as ALD, CVD, PVD, HDPCVD, MOCVD, RPCVD, PECVD, LPCVD, ALCVD, APCVD, spin coating, plating, other deposition process, or combinations thereof. In one embodiment, the one or more P-type work function layers are formed using ALD such that the formed one or more P-type work functional layers are conformal.

In some implementations, the one or more N-type work function layers may include any suitable n-type work function material, such as Ti, Al, Ag, Mn, Zr, TiAl, TiAlC, TaC, TaCN, TaSiN, TaAl, TaAlC, TiAlN, other n-type work function material, or combinations thereof. In the depicted embodiment, the one or more N-type work function layers include titanium and aluminum, such as TaAlC, TaAl, TiAlC, TiAl, TaSiAl, TiSiAl, TaAlN, or TiAlN. In some implementations, the one or more N-type work function layers are formed using a suitable deposition process, such as ALD, CVD, PVD, HDPCVD, MOCVD, RPCVD, PECVD, LPCVD, ALCVD, APCVD, spin coating, plating, other deposition process, or combinations thereof. In one embodiment, the one or more N-type work function layers are formed using ALD such that the formed one or more N-type work functional layers are conformal.

A metal fill (or bulk) layer may be formed over the N-type/P-type work function layer(s). The metal fill layer may include a suitable conductive material, such as Al, W, and/or Cu. In one embodiment, the metal fill layer includes W. In some alternative implementations, the metal fill layer may additionally or collectively include other metals, metal oxides, metal nitrides, other suitable materials, or combinations thereof. The metal fill layer may be formed using a suitable deposition process, such as ALD, CVD, PVD, HDPCVD, MOCVD, RPCVD, PECVD, LPCVD, ALCVD, APCVD, spin coating, plating, other deposition process, or combinations thereof. In one embodiment, the metal fill layer is formed using an ALD process such that the formed metal fill layer may be substantially conformal.

In some embodiments, a glue layer may be formed between the P-type/N-type work function layer(s) and the metal fill layer. In these embodiments, the glue layer includes a material that promotes adhesion between adjacent layers, such as N-type/P-type work function layers and subsequently formed layers of the first and second gate stacks 150A and 150B, such as the metal fill layer. In some instances, the glue layer may include metal (for example, W, Al, Ta, Ti, Ni, Cu, Co, other suitable metal, or combinations thereof), metal oxides, metal nitrides, or combinations thereof. In one embodiment, the glue layer includes titanium and nitrogen, such as TiN. The glue layer may be formed using a suitable deposition process, such as ALD, CVD, PVD, HDPCVD, MOCVD, RPCVD, PECVD, LPCVD, ALCVD, APCVD, spin coating, plating, other deposition process, or combinations thereof. In one embodiment, an ALD process may be used to conformally deposits glue layer on the N-type/P-type work function layer(s).

In some further embodiments, a blocking layer may be optionally formed before forming the metal fill layer, such that metal fill layer is disposed on the blocking layer. The blocking layer includes a material that blocks and/or reduces diffusion between gate stack layers, such as metal fill layer and N-type work function layer and/or P-type work function layer. In one embodiment, the blocking layer includes titanium and nitrogen, such as TiN. The blocking layer may be formed using an ALD process.

Upon deposition of layers of the first and second gate stacks 150A and 150B, a planarization process may be performed to remove excess gate stack materials from the top surface of the workpiece 100. For example, a CMP process is performed until a top surface of ILD layer 134 is reached (exposed). In the embodiments represented in FIGS. 16A and 16B, top surfaces of the first and second gate stacks 150A and 150B are substantially planar with a top surface of ILD layer 134 after the CMP process.

Figures 16A, 16B:
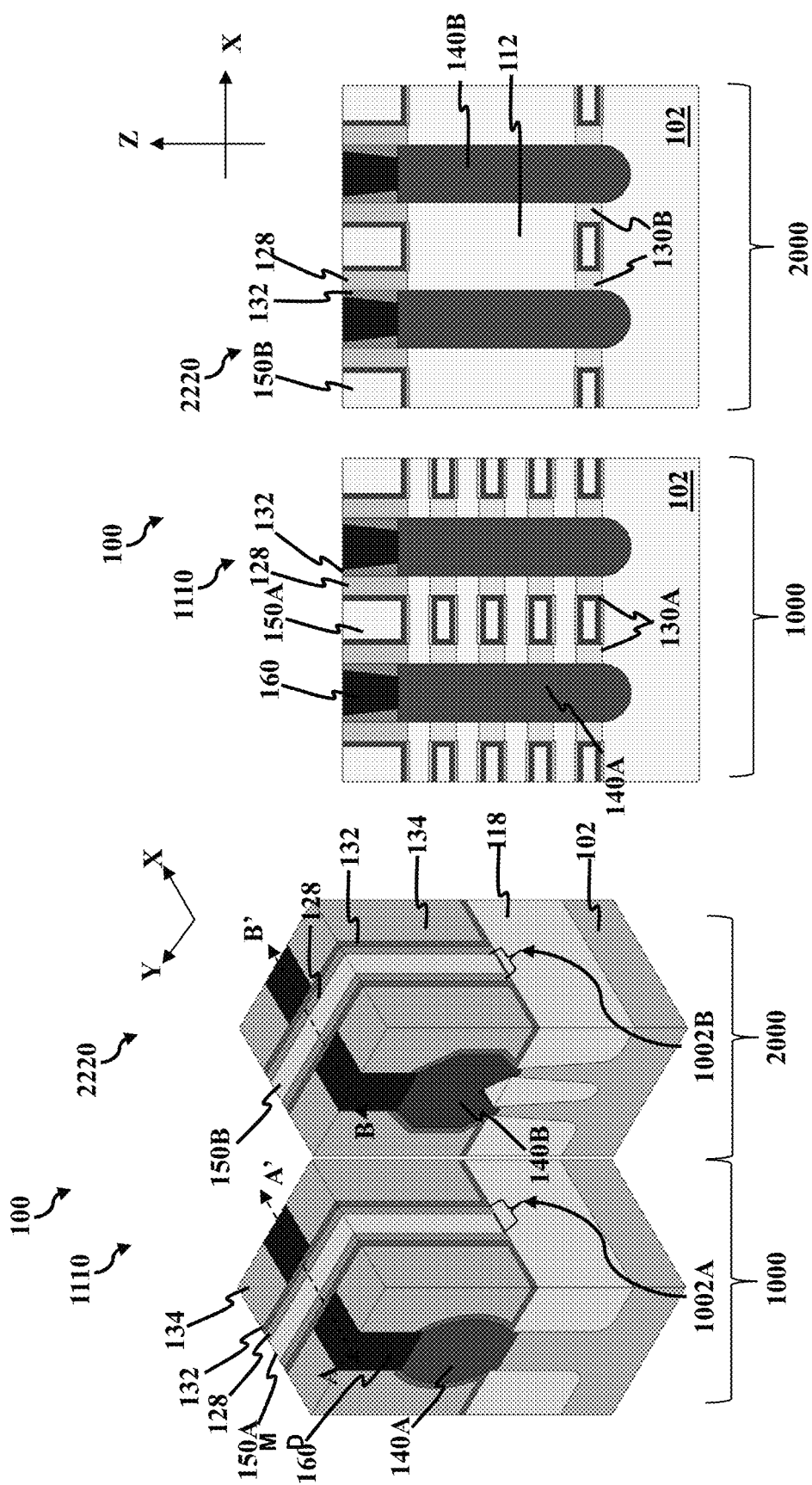

Referring now to FIGS. 1, 16A and 16B, the method 10 proceeds to block 34 where further processes are performed in the first region 1000 and the second region 2000 to complete the fabrication of the GAA transistors 1110 and 2220. For example, various contacts, such as source/drain contacts and gate contacts, can be formed to facilitate operation of GAA transistors. In some implementations, one or more ILD layers, similar to ILD layer 134, can be formed over the workpiece 100 (in particular, over ILD layer 134 and the first and second gate stacks 150A and 150B). Contacts can then be formed in ILD layer 134 and/or ILD layers disposed over ILD layer 134. In the embodiments represented in FIGS. 16A and 16B, source/drain contacts 160 are respectively electrically coupled with source/drain features 140A and 140B. Contacts, such as source/drain contacts 160 and gate contacts, include a conductive material, such as metal. The metal includes aluminum, aluminum alloy (such as aluminum/silicon/copper alloy), copper, copper alloy, titanium, titanium nitride, tantalum, tantalum nitride, tungsten, polysilicon, metal silicide, other suitable metals, or combinations thereof. In some embodiment, a metal silicide layer may be formed over the source/drain features 140A and 140B to reduce contact resistance between the source/drain features 140A and 140B, on the one hand, and the source/drain contacts 160, on the other. Such metal silicide may include nickel silicide, cobalt silicide, tungsten silicide, tantalum silicide, titanium silicide, platinum silicide, erbium silicide, palladium silicide, or combinations thereof. In some implementations, ILD layers disposed over ILD layer 134 and the contacts are a portion of an MLI feature disposed over substrate 102, as described above. The MLI feature can include a combination of metal layers and ILD layers configured to form vertical interconnect features, such as contacts and/or vias, and/or horizontal interconnect features, such as lines. The various conductive features include materials similar to the contacts. In some implementations, a damascene process and/or dual damascene process is used to form the MLI feature. In addition, as shown in FIG. 16B, the channel members in the first gate stack 150A are at least partially interleaved by the first inner spacer 130A while the channel members in the second gate stack 150B are spaced apart from the substrate 102 by the second inner spacer 130B.

At this point, an N-type GAA transistor 1110 including the first gate stack 150A is disposed in the first region 1000 and a P-type GAA transistor 2220 including the second gate stack 150B is disposed in the second region 2000. FIGS. 17 and 18 illustrate cross-sectional views of the first and second channel regions 1002A and 1002B, respectively, viewed along the X-direction in FIG. 16A. Referring first to FIG. 17, in some embodiments, the N-type GAA transistor 1110 includes a number N1 of first channel members 170A in the first channel region 1002A. The number N1 of first channel members 170A corresponds to the number of second semiconductor layers 106 in the alternating series of first semiconductor layers 104 and second semiconductor layers 106. In some embodiments, N1 is between 2 and 20. Each of the first channel members 170A includes a height H1 and a width W1. In some embodiments, because W1 is greater than H1, the first channel members 170A take a shape of a sheet and the N-type GAA transistor 1110 may be referred to as a nanosheet transistor. Further, because the first channel members 170A are vertically (along the Z direction) stacked, the N-type GAA transistor 1110 may also be referred to as a vertical nanosheet transistor or vertically-stacked nanosheet transistor. In some implementations, H1 is between about 2 nm and about 15 nm and W1 is between about 5 nm and about 50 nm. The first channel members 170A are disposed at a first pitch P1 and P1 is between about 8 nm and 25 nm. The first channel member 170A adjacent to the fin base or a top surface of the isolation feature 118 is spaced apart from the fin base or a top surface of the isolation feature 118 by a first spacing S1. In some instances, S1 is between about 3 nm and about 20 nm. In some embodiments, the surface plane defined by W1 and the channel length is the (100) crystal plane and represents the primary channel surface of the first channel member 170A.

Referring now to FIG. 18, in some embodiments, the P-type GAA transistor 2220 includes a number N2 of second channel members 170B in the second channel region 1002B. The number N2 of second channel members 170B corresponds to the number of second fins in the plurality of second fins 1200. In some embodiments, N2 is between 2 and 50. Each of the second channel members 170B includes a height H2 and a width W2. In some embodiments, because H2 is greater than W2, the second channel members 170B take a shape of a sheet and the P-type GAA transistor 2220 may be referred to as a nanosheet transistor. Further, because the second channel members 170B are horizontally (along the Y direction) arranged or disposed, the P-type GAA transistor 2220 may also be referred to as a horizontal nanosheet transistor. In some implementations, H2 is between about 20 nm and about 100 nm and W2 is between about 2 nm and about 15 nm. The second channel members 170B are disposed at a second pitch P2 and P2 is between about 8 nm and 50 nm. The second channel member 170B adjacent to the fin base or a top surface of the isolation feature 118 is spaced apart from the fin base or a top surface of the isolation feature 118 by a second spacing S2. In some instances, S2 is between about 3 nm and about 20 nm. In some embodiments, the plane defined by H2 and the channel length is the (110) crystal plane and represents the primary channel surface of the second channel member 170B.

In some embodiments, the total channel width for the N-type GAA transistor 1110 may be approximately and mathematically represented by two times of a product of N1 and W1 ((N1×W1)×2) and the total channel width for the P-type GAA transistor 2220 may be approximately and mathematically represented by two times of a product of N2 and H2 ((N2×H2)×2). The factor of two is included in these mathematical representations because each channel member has two long (or primary) sides. In some instances, twice the product of N1 and W1 ((N1×W)×2) is substantially equal to twice the product of N2 and H2 ((N2×H2)×2). In some implementations, because the N-type GAA transistor 1110 and the P-type GAA transistor 2220 have the same channel length, a foot print of the first channel members 170A on the substrate 102 can be represented by a product of W1 and the channel length and the second foot print of the second channel members 170B on the substrate 102 can be represented by a product of (W2+(N2−1)×P2) and the channel length. With respect to individual channel members, each of the first channel members 170A shares the same channel length (i.e. channel-length-wise dimension) with each of the second channel members 170B. In some instances, the first footprint is substantially equal to the second footprint. In some implementations, because H2 is greater than W1, N1 is greater than N2.

Reference is now made to FIGS. 19 and 20. In some embodiments, besides the first region 1000 and the second region 2000, the workpiece 100 may include a third region 3000, illustrated in FIG. 19. In some implementations, the third region 3000 is a region for long-channel gate-all-around (GAA) transistors 3330 for analog or input/output (I/O) applications. The channel length L of these long-channel GAA transistors 3330 is about 3 to about 10 times of the channel length of the N-type GAA transistor 1110 or the P-type GAA transistor 2220, which may have substantially the same channel length. FIG. 19 is therefore a cross-sectional view of the long-channel GAA transistor 3330 along the channel length L direction. FIG. 20 is a cross-sectional view of a third gate stack 150C over a third channel region 1002C of the long-channel GAA transistor 3330. As can be told from FIG. 20, because the channel member height H3 of the horizontal nanosheet GAA transistor (see for example, the horizontal nanosheet GAA in FIG. 18), such as the long-channel GAA transistor 3330, is greater than its channel member width W3, the channel members of a horizontal nanosheet GAA transistor suffer less vertical (along the Z-direction) deflection than those of a vertical nanosheet GAA transistor, where deflection of the channel members may result in failure of the transistor. It follows that a horizontal nanosheet GAA transistor is suitable to be formed into a long-channel GAA transistor, such as the long-channel GAA transistor 3330. For that reason, in some embodiments, the third region 3000 may undergo similar operations in blocks 14 and 16 of method 10 and include an epitaxial semiconductor layer (similar to the epitaxial semiconductor layer 112), rather than an alternating series of first semiconductor layers 104 and second semiconductor layers 106. In the embodiments represented in FIG. 19, third channel members 170C of the long-channel GAA transistor 3330 have a cross-sectional view illustrated in FIG. 20. In some implementations, the long-channel GAA transistors 3330 are N-type GAA transistors and include third source/drain features 140C, which are also N-type. In some instances, the third source/drain features 140C may be epitaxially formed of silicon doped in-situ or by implantation with an N-type dopant, such as phosphorous or arsenide. In some implementations, the third channel members 170C in FIG. 20 have a primary channel surface on the (110) crystal plane. Although electron mobility on the (110) crystal plane is smaller than that on the (100) crystal plane, it is sufficient for analog or input/output (I/O) applications. The third channel members 170C have a width W3, a height H3 and a pitch P3. In some instances, W3, H3 and P3 are substantially equal to W2, H2 and P2. In some embodiments, the number N3 of the third channel members 170C may be substantially similar to the number N2.

The present disclosure provides several advantages. Electron mobility on the (100) crystal plane is greater than that on the (110) crystal plane, while hole mobility on the (110) crystal plane is greater than that on the (100) crystal plane. By having the primary channel surface on the (100) crystal plane, the first channel members 170A has increased carrier (electrons, for N-type transistors) mobility of the N-type GAA transistor 1110 in the first region 1000. Similarly, by having the primary channel surface on the (110) crystal plane, the second channel members 170B has increased carrier (protons, for P-type transistors) mobility of the P-type GAA transistor 2220 in the second region 2000. In addition, the N-type GAA transistor 1110 and the P-type GAA transistor 2220 may include substantially the same footprint while the total channel surface area of the N-type GAA transistor 1110 is substantially equal to the total channel surface area of the P-type GAA transistor 2220. The substantial similar footprints and channel surface areas aid modulation and design of devices that include both N-type and P-type GAA transistors.

The present disclosure provides for many different embodiments. In one embodiment, a semiconductor device is provided. The semiconductor device includes a first gate-all-around (GAA) transistor over a first region of a substrate and a second GAA transistor over a second region of the substrate. The first GAA transistor includes a plurality of first channel members stacked along a first direction vertical to a top surface of the substrate, a first gate structure over the plurality of first channel members, and two first source/drain (S/D) features sandwiching the plurality of first channel members. The second GAA transistor includes a plurality of second channel members stacked along a second direction parallel to the top surface of the substrate; a second gate structure over the plurality of second channel members, and two second S/D features sandwiching the plurality of second channel members. The plurality of first channel members and the plurality of second channel members include a semiconductor material having a first crystal plane and a second crystal plane different from the first crystal plane. The first direction is normal to the first crystal plane and the second direction is normal to the second crystal plane.

In some embodiments, the first GAA transistor is N-type and the second GAA transistor is P-type. In some implementations, the first crystal plane is a (100) plane and the second crystal plane is a (110) plane. In some instances, each of the plurality of first channel members has a first width parallel to the top surface of the substrate and a first height vertical to the top surface of the substrate and each of the plurality of second channel members has a second width parallel to the top surface of the substrate and a second height vertical to the top surface of the substrate. In those instances, the first width is greater than the first height and the second width is smaller than the second height. In some embodiments, the two first S/D features include silicon and an N-type dopant and the two second S/D features include silicon germanium and a P-type dopant. In some implementations, the semiconductor material comprises silicon. In some embodiments, the plurality of first channel members is interleaved by a plurality of first inner spacer features and the plurality of second channel members is separated from the substrate by a plurality of second inner spacer features. A topmost first inner spacer feature of the plurality of first inner spacer features is farther away from the substrate than a topmost second inner spacer feature of the plurality of second inner spacer features. In some implementations, a channel length of the plurality of first channel members and a channel length of the plurality of second channel members are substantially the same.

In another embodiment, a semiconductor device is provided. The semiconductor device includes a first gate-all-around (GAA) transistor over a first region of a substrate and a second GAA transistor over a second region of the substrate. The first GAA transistor includes a plurality of first channel members stacked along a first direction vertical to a top surface of the substrate, and a N-type source/drain (S/D) feature. The second GAA transistor includes a plurality of second channel members stacked along a second direction parallel to the top surface of the substrate and a P-type S/D feature. The plurality of first channel members and the plurality of second channel members include silicon having a first crystal plane and a second crystal plane different from the first crystal plane. The first direction is normal to the first crystal plane and the second direction is normal to the second crystal plane.

In some embodiments, the first crystal plane is a (100) plane and the second crystal plane is a (110) plane. In some implementations, the first GAA transistor has a first footprint on the substrate and the second GAA transistor has a second footprint on the substrate and the first footprint is substantially identical to the second footprint. In some instances, a first total channel width of the first GAA transistor is substantially identical to a second total channel width of the second GAA transistor. In some embodiments, the plurality of first channel members includes a first number (N1) of first channel members and the plurality of second channel members includes a second number (N2) of second channel members. In some instances, the first number (N1) is greater than the second number (N2). In some embodiments, each of the plurality of first channel members has a first width (W1) parallel to the top surface of the substrate and a first height (H1) vertical to the top surface of the substrate and each of the plurality of second channel members has a second width (W2) parallel to the top surface of the substrate and a second height (H2) vertical to the top surface of the substrate. In those embodiments, the first width (W1) is greater than the first height (H1) and the second width (W2) is smaller than the second height (H2). In some implementations, a first total channel width of the first GAA transistor includes two times of a product of the first number and the first width ((N1×W1)×2) and a second total channel width of the second GAA transistor includes two times of a product of the second number and the second height ((N2×H2)×2). The first total channel width is substantially equal to the second total channel width. In some implementations, the semiconductor device further includes a third GAA transistor over a third region of the substrate. The third GAA transistor includes a plurality of third channel members stacked along the second direction parallel to the top surface of the substrate, and a S/D feature. In those implementations, the S/D feature is N-type, the first GAA transistor has a first channel length, the second GAA transistor has a second channel length and the third GAA transistor has a third channel length. In those embodiments, the first channel length is substantially identical to the second channel length, and the third channel length is greater than the first channel length. In some instances, the first GAA transistor is an input/output (I/O) GAA transistor.

In yet another embodiment, a method is provided. The method includes providing a workpiece including an alternating series of first semiconductor layers and second semiconductor layers over a first region and a second region of a substrate; removing a portion of the alternating series of first and second semiconductor layers over the second region of the workpiece; forming an epitaxial semiconductor layer in the second region; recessing the workpiece to form a first fin in the first region and a plurality of second fins in the second region; forming a first dummy gate stack over a first channel region of the first fin and a second dummy gate stack over a second channel region of the plurality of second fins; forming a gate spacer over sidewalls of the first and second dummy gate stacks; recessing the first fin and the plurality of second fins to leave a portion of the first fin under the first dummy gate stack and a portion of the plurality of second fins under the second dummy gate stack; forming first source/drain features sandwiching the portion of the first fin and second source/drain features sandwiching the portion of the plurality of second fins; removing the first and second dummy gate stacks; and removing the first semiconductor layers from the first channel region of the first fin and the epitaxial semiconductor layer from the second channel region of the plurality of second fins.

In some embodiments, the first semiconductor layers consist essentially of silicon germanium and the second semiconductor layers consist essentially of silicon. In some embodiments, the epitaxial semiconductor layer consists essentially of silicon. In some implementations, the method further includes, prior to the forming of the first source/drain features and the second source/drain features, forming inner spacers between the second semiconductor layers. In some implementations, the first source/drain features are N-type and the second source/drain features are P-type.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    providing a workpiece including an alternating series of first semiconductor layers and second semiconductor layers disposed directly on a first region and a second region of a semiconductor substrate;
    removing a portion of the alternating series of first and second semiconductor layers over the second region of the workpiece;
    forming an epitaxial semiconductor layer in the second region;
    recessing the workpiece to form a first fin in the first region and a plurality of second fins in the second region;
    forming a first dummy gate stack over a first channel region of the first fin and a second dummy gate stack over a second channel region of the plurality of second fins;
    forming a gate spacer over sidewalls of the first and second dummy gate stacks;
    recessing the first fin and the plurality of second fins to leave a portion of the first fin under the first dummy gate stack and a portion of the plurality of second fins under the second dummy gate stack;
    forming first source/drain features sandwiching the portion of the first fin and second source/drain features sandwiching the portion of the plurality of second fins;
    removing the first and second dummy gate stacks; and
    removing the first semiconductor layers from the first channel region of the first fin and the epitaxial semiconductor layer from the second channel region of the plurality of second fins.

2. The method of claim 1, wherein the semiconductor substrate is a bulk silicon substrate.

3. The method of claim 1, wherein the first semiconductor layers consist essentially of silicon germanium and the second semiconductor layers consist essentially of silicon.

4. The method of claim 1, wherein the epitaxial semiconductor layer consists essentially of silicon.

5. The method of claim 1, further comprising:
    prior to the forming of the first source/drain features and the second source/drain features, forming first inner spacers between the second semiconductor layers.

6. The method of claim 1, further comprising:
prior to the forming of the first source/drain features and the second source/drain features, forming second inner spacers between the plurality of second fins and the semiconductor substrate.

7. The method of claim 1, wherein the first source/drain features are N-type and the second source/drain features are P-type.

8. The method of claim 1, wherein the removing of the portion of the alternating series of first and second semiconductor layers over the second region of the workpiece does not remove a bottommost first semiconductor layer.

9. The method of claim 8, wherein the forming of the epitaxial semiconductor layer comprises forming the epitaxial semiconductor layer directly on the bottommost first semiconductor layer.

10. The method of claim 8, wherein the removing of the first semiconductor layers comprises removing the bottommost first semiconductor layer.

11. A method, comprising:
providing a workpiece including an alternating series of first semiconductor layers and second semiconductor layers disposed directly on a first region and a second region of a semiconductor substrate;
removing the alternating series of first and second semiconductor layers over the second region of the workpiece except for a bottommost first semiconductor layer;
forming an epitaxial semiconductor layer on the bottommost first semiconductor layer in the second region;
patterning the workpiece to form a first fin from the alternating series of first and second semiconductor layers in the first region and a plurality of second fins out of the epitaxial semiconductor layer and the bottommost first semiconductor layer in the second region;
forming a first dummy gate stack over a first channel region of the first fin and a second dummy gate stack over a second channel region of the plurality of second fins;
forming a gate spacer over sidewalls of the first dummy gate stack and sidewalls of the second dummy gate stack;
after the forming of the gate spacer, recessing a first source/drain region of the first fin and a second source/drain region of the plurality of second fins;
after the recessing, forming a first source/drain feature to couple to the first channel region of the first fin and a second source/drain feature to couple to the second channel region of the plurality of second fins;
removing the first and second dummy gate stacks;
removing the first semiconductor layers from the first channel region of the first fin to form first channel members; and
removing the bottommost first semiconductor layer to form second channel members.

12. The method of claim 11,
wherein the first channel members comprise a first pitch along a vertical direction,
wherein the second channel members comprise a second pitch along a horizontal direction,
wherein the first pitch is between about 8 nm and about 25 nm,
wherein the second pitch is between about 8 nm and about 50 nm.

13. The method of claim 11,
wherein the first dummy gate stack and the second dummy gate stack extending along a direction,
wherein each of the first channel members includes a first width along the direction and a first height smaller than the first width,
wherein each of the second channel members includes a second width along the direction and a second height greater than the second width.

14. The method of claim 11, further comprising:
before the forming of the first source/drain feature and the second source/drain feature, forming first inner spacers between the second semiconductor layers and second inner spacers between the plurality of second fins and the semiconductor substrate.

15. The method of claim 14, wherein the forming of the first inner spacers and the second inner spacers comprises exposing the first semiconductor layers and the bottommost first semiconductor layer to water at an oxidation temperature.

16. The method of claim 15, wherein the oxidation temperature is lower than a temperature to oxidize silicon in presence of water.

17. A method, comprising:
providing a workpiece including an alternating series of silicon germanium (SiGe) layers and silicon (Si) layers disposed directly on a first region and a second region of a silicon substrate;
removing the alternating series of SiGe layers and Si layers over the second region of the workpiece except for a bottommost SiGe layer;
forming an epitaxial silicon (Si) layer on the bottommost SiGe layer in the second region;
patterning the workpiece to form a first fin from the alternating series of SiGe layers and Si layers in the first region and a plurality of second fins out of the epitaxial Si layer and the bottommost SiGe layer in the second region;
forming a first dummy gate stack over a first channel region of the first fin and a second dummy gate stack over a second channel region of the plurality of second fins;
forming a gate spacer over sidewalls of the first dummy gate stack and sidewalls of the second dummy gate stack;
after the forming of the gate spacer, recessing a first source/drain region of the first fin and a second source/drain region of the plurality of second fins;
after the recessing, forming a first source/drain feature to couple to the first channel region of the first fin and a second source/drain feature to couple to the second channel region of the plurality of second fins;
removing the first and second dummy gate stacks;
removing the SiGe layers from the first channel region of the first fin to form first channel members; and
removing the bottommost SiGe layer to form second channel members.

18. The method of claim 17, wherein the gate spacer comprises silicon oxide, silicon nitride, silicon oxynitride, or silicon carbide.

19. The method of claim 17, further comprising:
prior to the forming of the first source/drain feature and the second source/drain feature, forming first inner spacers between first channel members and second inner spacers between the second channel members and the Si substrate.

20. The method of claim 19, wherein the forming of the first inner spacers and the second inner spacers comprises exposing the SiGe layers and the bottommost SiGe layer to water at an oxidation temperature.

\* \* \* \* \*